| (12) | United States Patent | (10) Patent No.: | US 8,536,578 B2 |
|---|---|---|---|
| | Cha et al. | (45) Date of Patent: | Sep. 17, 2013 |

(54) THIN FILM TRANSISTOR COMPRISING NANOWIRES AND FABRICATION METHOD THEREOF

(75) Inventors: Seung Nam Cha, Seoul (KR); Byong Gwon Song, Seoul (KR); Jae Eun Jang, Seoul (KR)

(73) Assignee: Samsung Electronics Co., Ltd. (KR)

( * ) Notice: Subject to any disclaimer, the term of this patent is extended or adjusted under 35 U.S.C. 154(b) by 491 days.

(21) Appl. No.: 12/243,407

(22) Filed: Oct. 1, 2008

(65) Prior Publication Data

US 2009/0206321 A1  Aug. 20, 2009

(30) Foreign Application Priority Data

Feb. 18, 2008  (KR) .................. 10-2008-0014480

(51) Int. Cl.
*H01L 21/84* (2006.01)
*H01L 29/06* (2006.01)

(52) U.S. Cl.
USPC .......... 257/66; 257/13; 257/24; 257/E33.043; 438/158

(58) Field of Classification Search
CPC ....................................... H01L 21/84
USPC ............................................ 257/66
See application file for complete search history.

(56) References Cited

U.S. PATENT DOCUMENTS

| 4,393,758 | A | 7/1983 | Anmahian |
| 2006/0284171 | A1 | 12/2006 | Levy et al. |
| 2007/0120167 | A1* | 5/2007 | Duan et al. ............ 257/296 |

FOREIGN PATENT DOCUMENTS

| JP | 2006147843 | 6/2006 |
| JP | 2007005684 | 1/2007 |
| KR | 1020060107107 | 10/2006 |
| KR | 1020070032389 | 3/2007 |

\* cited by examiner

*Primary Examiner* — Jarrett Stark
*Assistant Examiner* — Lawrence Tynes, Jr.
(74) *Attorney, Agent, or Firm* — Cantor Colburn LLP

(57) ABSTRACT

A thin film transistor includes nanowires. More specifically, the thin film transistor includes nanowires aligned between and extending to opposite facing lateral surfaces of source/drain electrodes on a substrate. The nanowires extend in a direction parallel to a major surface defining the substrate to form a semiconductor channel layer. Also disclosed herein is a method for fabricating the thin film transistor.

13 Claims, 5 Drawing Sheets

THIN FILM TRANSISTOR COMPRISING NANOWIRES AND FABRICATION METHOD THEREOF

This application claims priority to Korean Patent Application No. 2008-14480, filed on Feb. 18, 2008, and all the benefits accruing therefrom under U.S.C. §119, the contents of which in their entirety are herein incorporated by reference.

BACKGROUND OF THE INVENTION

1. Field of the Invention

This disclosure is directed to a thin film transistor which includes nanowires and a method for fabricating the same. More specifically, the thin film transistor includes nanowires aligned between opposite lateral surfaces of source/drain electrodes and extending in a direction parallel to a major surface plane defining a substrate on which the source/drain electrodes are formed to form a semiconductor channel layer.

2. Description of the Related Art

Nanowires are ultrafine wires having a diameter in the nanometer range and having a length which is several hundred nanometers, or having a length on the order of micrometers or millimeters. Nanowires exhibit various physical properties depending on their diameter and length. Nanowires can find various applications in highly integrated devices due to their small size, and offer advantages in that electron mobility in particular directions and optical properties, such as polarization, are inherent to nanowires that can be utilized.

In response to the recent demand for the miniaturization and high performance of devices, nanometer-scale devices have been designed and developed. Particularly, active attempts have been made to apply nanowires to nanometer-scale devices.

Many devices using nanowires as semiconductor materials are currently being developed. In these devices, nanowires are arranged on substrates by suitable techniques, such as nanomanipulation, hydrodynamic alignment, alignment by imprinting and alignment using hydrophilicity and/or hydrophobicity of liquid.

BRIEF SUMMARY OF THE INVENTION

Disclosed herein is an exemplary embodiment of a thin film transistor including nanowires aligned between opposite facing lateral surfaces of source/drain electrodes in a direction parallel to a major surface defining a substrate on which the source/drain electrodes are formed to form a semiconductor channel layer.

The semiconductor channel layer of the thin film transistor has high electron mobility.

Also disclosed herein is a display device which includes the thin film transistor.

Also disclosed herein is a method for fabricating a thin film transistor. The method includes forming crystal planes of seeds on one or two opposite facing lateral surfaces of electrodes selected from source and drain electrodes on a substrate, and epitaxially growing nanowires from the crystal planes of seeds in a direction parallel to a major surface defining the substrate.

The nanowires are grown to form a semiconductor channel layer between the electrodes.

BRIEF DESCRIPTION OF THE DRAWINGS

Exemplary embodiments will be more clearly understood from the following detailed description taken in conjunction with the accompanying drawings, in which:

FIG. 1b is an enlarged perspective view of the circled portion of the thin film transistor of FIG. 1a;

FIG. 2b is an enlarged perspective view of the circled portion of the thin film transistor of FIG. 2a.

DETAILED DESCRIPTION OF THE INVENTION

Hereinafter, a detailed description will be given of exemplary embodiments with reference to the accompanying drawings. The relative thicknesses and positioning of layers and/or regions may be reduced or exaggerated for clarity.

It will be understood that when an element or layer is referred to as being "on," "interposed," "disposed," or "between" another element or layer, it can be directly on, interposed, disposed, or between the other element or layer or intervening elements or layers may be present.

It will be understood that, although the terms first, second, third, and the like may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

As used herein, the singular forms "a," "an" and "the" are intended to comprise the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

According to an exemplary embodiment, there is provided a thin film transistor comprising nanowires aligned between opposite lateral surfaces defining facing edges of source/drain electrodes in a direction parallel to a major surface plane defining a substrate on which the source/drain electrodes are formed to form a semiconductor channel layer.

In an exemplary embodiment, a semiconductor channel layer of the thin film transistor may be composed of bundles of the nanowires.

In an alternative exemplary embodiment, the nanowires may be epitaxially grown from crystal planes in a direction parallel to the major surface plane of the substrate and formed on the lateral facing surfaces of the source/drain electrodes.

Figure 1A:
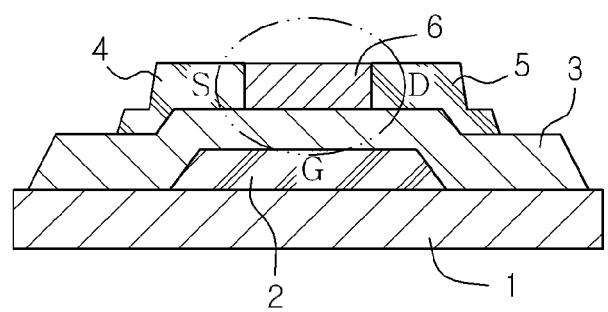
FIG. 1a is a schematic cross-sectional view of an exemplary embodiment of a thin film transistor.
Figure 1B:
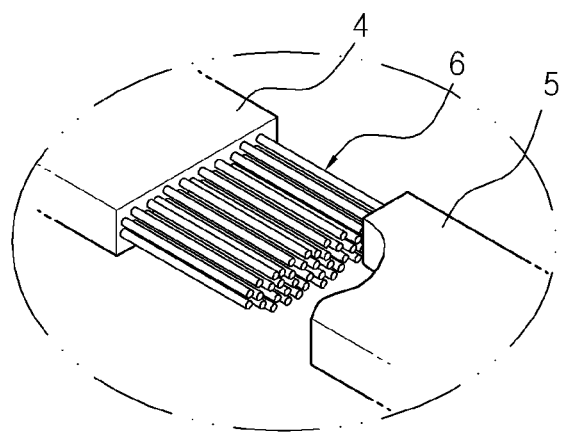

FIG. 1a is a cross-sectional view of an exemplary embodiment of a thin film transistor. FIG. 1b is an enlarged perspective view of the circled portion of the thin film transistor of FIG. 1a. The thin film transistor is one cell from an array of thin film transistors. Referring to FIG. 1a, the thin film transistor includes a gate electrode 2 formed on a substrate 1. A gate insulating film 3 is disposed on the substrate 1 and gate electrode 2. A source electrode 4 and drain electrode 5 are formed on the gate insulating film 3. A semiconductor channel layer 6 is disposed between the source/drain electrodes 4 and 5.

Referring to FIGS. 1a and 1b, the thin film transistor comprises nanowires extending in one direction without being cut to form the semiconductor channel layer 6 between source/drain electrodes 4 and 5. The nanowires are aligned in a direction parallel to a major surface plane defining a substrate 1 on which the source/drain electrodes are formed from opposite lateral facing surfaces of the source/drain electrodes 4 and 5. The nanowires may exist in the form of bundles. The nanowires are arranged and extend in a direction parallel to the substrate 1 to form the semiconductor channel layer 6 between the source/drain electrodes 4 and 5. Due to the presence of the nanowires, the thin film transistor has high electron mobility.

In a typical prior art thin film transistor based on the migration of electrons between nanowires as materials for a semiconductor channel layer, a continuous flow of the electrons between the nanowires is not satisfactorily achieved. In contrast, electrons flow continuously without stopping in the thin film transistor of exemplary embodiments using a semiconductor channel composed of nanowires to connect the source electrode 4 and the drain electrode 5, thus achieving a high electron mobility of the thin film transistor.

There is no particular restriction on the preparation method of the nanowires. For example, the nanowires can be prepared by inducing the growth of crystals from seeds. The use of seeds is based on the principle that nanowire crystals have a strong tendency to grow (epitaxial growth) in a direction perpendicular with respect to a crystal plane. Specifically, opposite facing lateral surfaces of the source/drain electrodes 4 and 5 are treated with seeds for the growth of nanowire crystals to form crystal planes. Then nanowires are epitaxially grown from the crystal planes in a direction parallel to the major surface plane defining the substrate 1 and perpendicular to the crystal planes (lateral facing surfaces of the source/drain electrodes 4 and 5) to form the semiconductor channel layer 6.

Any material capable of growing into crystals and showing semiconductor characteristics can be used for the nanowires. In exemplary embodiments, a material with high electron mobility is used. Examples of suitable materials for the nanowires include, but are not limited to, Si, GaN, GaAs and ZnO nanowires whose electron mobility is as high as 1,000 $cm^2/Vs$. Materials which are generally used in the art can be used, without any particular limitation, to form the source/drain electrodes 4 and 5. In exemplary embodiments, materials that make suitable ohmic contact with the nanowires of the semiconductor channel layer 6. Suitable materials for the source/drain electrodes 4 and 5 include niobium (Nb) and platinum (Pt), but are not limited thereto.

Figure 2A:
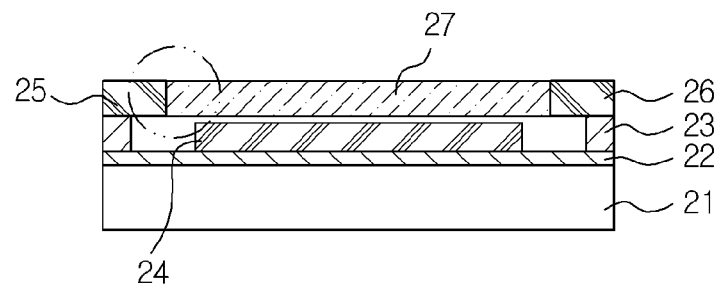
FIG. 2a is another schematic cross-sectional view of an exemplary embodiment of a thin film transistor.
Figure 2B:
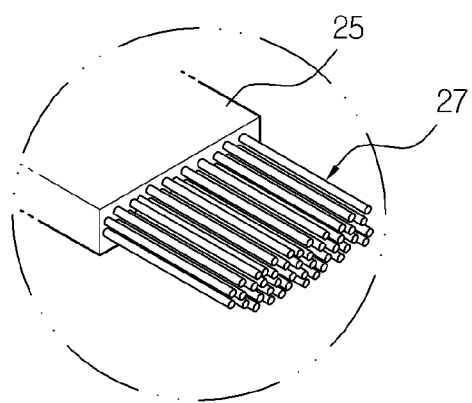

There is no particular restriction on the structure of the thin film transistor. In an exemplary embodiment, the thin film transistor may have a bottom gate or top gate structure. In an alternative exemplary embodiment, the thin film transistor may have an undercut structure, as illustrated in FIG. 2a. FIG. 2a is another schematic cross-sectional view of an exemplary embodiment of a thin film transistor. FIG. 2b is an enlarged perspective view of the circled portion of the thin film transistor of FIG. 2a.

FIG. 2a illustrates an insulating layer 22 formed on a substrate 21. A gate electrode 24 and spacers 23 are formed on the insulating layer 22. Source/drain electrodes 25 and 26 are formed on respective spacers 23 and a semiconductor channel layer 27 is formed between the source/drain electrodes 25 and 26, as in the embodiment of FIGS. 1a and 1b.

In the undercut structure shown in FIG. 2A, the gate electrode 24 is insulated from the source/drain electrodes 25 and 26 without an additional gate insulating film to prevent current leakage between the source/drain electrodes 25 and 26.

There is no particular restriction on the fabrication method of the thin film transistor. The thin film transistor can be fabricated by methods commonly used in the art.

In accordance with another exemplary embodiment, there is provided a method for fabricating the thin film transistor, which comprises forming crystal planes of seeds on one or two opposite facing lateral surfaces of electrodes selected from source and drain electrodes, and epitaxially growing nanowires from the crystal planes of seeds in a direction parallel to a major surface defining a substrate on which the electrodes are disposed. In exemplary embodiments, the crystal planes of seed are perpendicular to the growth direction of the nanowires.

For example, referring to FIGS. 3a through 3g, the thin film transistor having an undercut structure is fabricated by a method comprising: forming an insulating layer 32 on a substrate 31, disposing a spacer 33 and an electrode layer 34 in this order on the substrate 31; coating a photoresist on the electrode layer 34 and patterning the photoresist to leave photoresist layers 35; undercut etching the electrode layer 34 to leave a source electrode 41 and a drain electrode 42; undercut etching the spacer 33 to form an undercut structure; coating the undercut structure with seeds to form seed layers 36 on the photoresist layers 35, opposite facing lateral surfaces of the source/drain electrodes 41 and 42 and the photoresist layers, and areas of the insulating layer 32 exposed through the photoresist layers to form an undercut structure; forming gate electrodes 37 on the undercut structure by deposition; lifting off the photoresist layers 35; and crystallizing the seed layers 36 formed on the opposite facing lateral surfaces of the source/drain electrodes 41 and 42 to form crystal planes and epitaxially growing nanowires in a direction parallel to the major surface defining the substrate 31 from the crystal planes to form a semiconductor channel 38 between the opposite facing lateral surfaces of the source/drain electrodes 41 and 42.

FIGS. 3a through 3g are process flow diagrams illustrating the exemplary method. The thin film transistor is one cell from an array of thin film transistors.

Figure 3A:
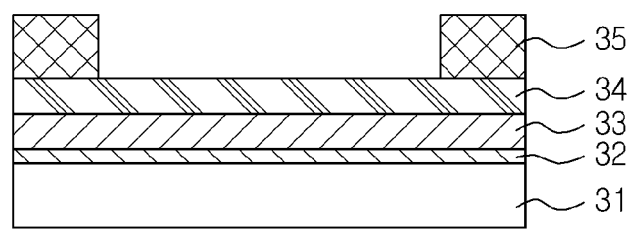
FIGS. 3a through 3g are exemplary process flow diagrams illustrating an exemplary method for fabricating a thin film transistor.

In more detail, referring to FIG. 3a, first, the insulating layer 32, the spacer 33 and the electrode layer 34 are sequentially formed on the substrate 31. The spacer 33 is preferably formed using a material capable of selective etching for an electrode material. In exemplary embodiments, the electrode layer 34, the insulating layer 32 and the spacer 33 are formed of different materials. The reason for the use of different materials is to prevent etching of one of the layers from affecting the other layers. In exemplary embodiments, the spacer 33 is formed having a thickness of about 50 nm to about 100 nm. Molybdenum (Mo) may be used to form the spacer 33. In exemplary embodiments, the electrode layer 34 is formed having a thickness of about 200 nm to about 400 nm. A photoresist is coated on the electrode layer 34, followed by patterning through a photomask to leave photoresist layers 35. Any known technique can be used to pattern the photoresist. For example, photolithography is performed to pattern the photoresist. According to photolithography, a photoresist composition is coated on the electrode layer 34, selectively exposed to a suitable light source, e.g., ultra violet ("UV"), through a photomask, and developed to form a pattern.

Figure 3B:
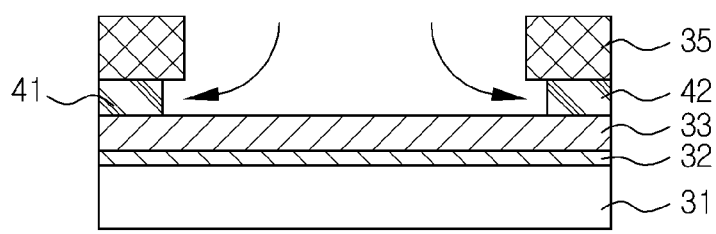

Referring to FIG. 3b, an exposed portion of the electrode layer 34 through the photoresist layers 35 is undercut etched in the directions indicated by arrows to leave a source electrode 41 and a drain electrode 42. The undercut etching of the electrode layer 34 is conducted by sequential dry etching and wet etching. At this time, the electrode layer 34 is undercut etched in such a manner that the source and drain electrodes 41 and 42 are formed about 50 nm to about 100 nm more inward than the overlying photoresist layers 35. The thickness of the undercut-etched electrode layer may be varied by controlling the etching factors, e.g., etching time and concentration of an etching solution used.

Figure 3C:
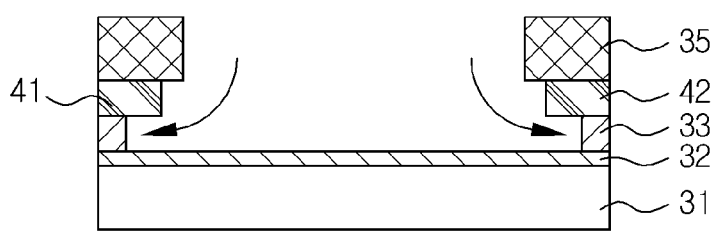

Referring to FIG. 3c, the spacer 33 is undercut etched in the directions indicated by arrows to leave spacer layers 33. The undercut etching of the spacer 33 can be conducted by wet etching. At this time, the spacer 33 is undercut etched in such a manner that the spacer layers 33 are formed about 500 nm to about 1,000 nm more inward than the source and drain electrodes 41 and 42. The thickness of the undercut-etched spacer 33 may be varied by controlling the etching factors, e.g., etching time and concentration of an etching solution used. As a result of the undercut etching of the electrode layer 34 and the spacer 33, an undercut structure is formed as shown in FIG. 3c.

Figure 3D:
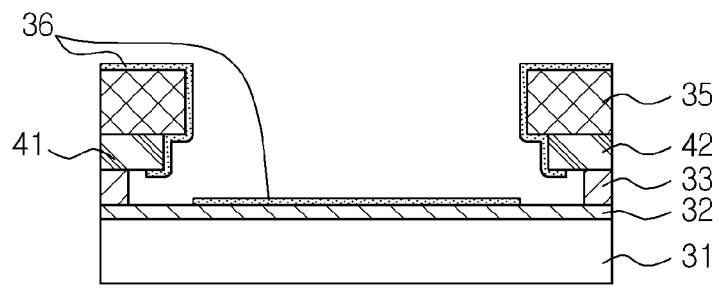

Referring to FIG. 3d, seeds are coated on the undercut structure to form seed layers 36. Specifically, a solution of the seeds can be coated on an array of thin film transistors by known deposition processes. Examples of suitable deposition processes include physical vapor deposition ("PVD") processes, such as sputtering and evaporation, and chemical vapor deposition ("CVD") processes, such as thermal chemical vapor deposition and plasma-enhanced chemical vapor deposition. Step coverage is particularly desirable. In this step, the seed layers 36 are formed on the photoresist layers 35, opposing facing lateral surfaces of the source/drain electrodes 41 and 42 and the photoresist layers 35, and areas of the insulating layer 32 exposed through the photoresist layers 35. In exemplary embodiments, the lateral surfaces of the spacer layers 33 and the lower surfaces of the photoresist layers 35 are not coated, i.e., the upper surfaces of the electrode layers. The seed layers 36 are places where nanowires are grown to form the semiconductor channel layer 38 in the subsequent step. The seed layers 36 are preferably composed of Si, GaN, GaAs, ZnO, etc. In exemplary embodiments the seed layers 36 are formed having a thickness of about 20 nm to about 40 nm.

Figure 3E:
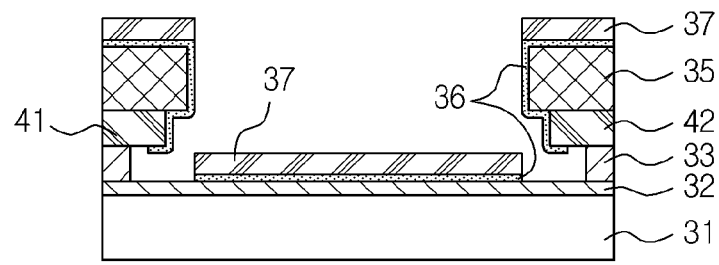

Referring to FIG. 3e, gate electrodes 37 are formed on the undercut structure coated with the seed layers 36 by deposition. In exemplary embodiments, a gate electrode material is deposited on the array of thin film transistors by evaporation, which is a high-linearity deposition process, to form the gate electrodes 37. As a result of the deposition, the gate electrodes 37 are formed only on areas of the undercut structure exposed in the upward direction and are not formed on the layers underlying the photoresist layers. Any known material may be used to form the gate electrodes 37, and non-limiting examples thereof include Cr, Nb and Au. The gate electrodes preferably have a thickness of about 100 nm. The thickness of the gate electrodes 37 may be varied by controlling the deposition factors, e.g., evaporation time.

Figure 3F:
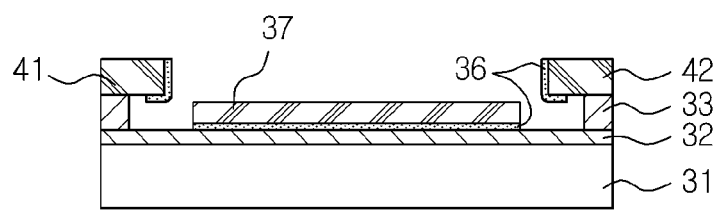

Referring to FIG. 3f, the photoresist layers 35 are removed by lifting off. The lifting off is a process wherein the photoresist layers 35 are removed using a solution or an organic solvent (e.g., acetone) capable of dissolving the photoresist. As a result, the seed layers 36 formed on the top and lateral surfaces of the photoresist layers 35 and the gate electrodes 37 formed over the photoresist layers 35 are completely removed to leave the structure shown in FIG. 3f.

That is, although a gate insulating film is not formed in the undercut structure of the thin film transistor, the gate electrode 37 is insulated from the source/drain electrodes 41 and 42 to prevent current leakage between the source/drain electrodes 41 and 42. In addition, the gate electrode 37 is formed without using an additional mask, resulting in a considerable reduction in the fabrication cost of the thin film transistor.

Figure 3G:
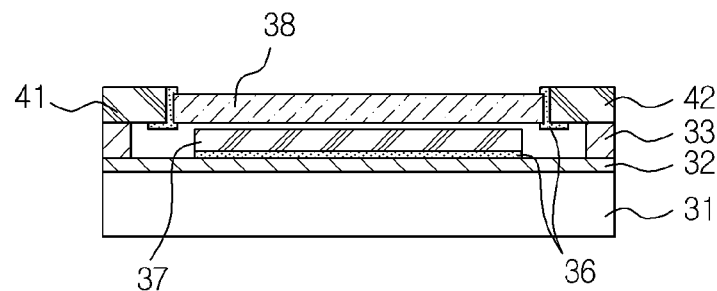

Referring to FIG. 3g, the semiconductor channel layer 38 composed of nanowires is formed by inducing the growth of nanowire crystals from the seed layers 36 to complete the fabrication of the thin film transistor. The crystal growth induction allows the nanowires to be arranged in a direction parallel to the major surface defining the substrate 31 and extend in one direction between the source/drain electrodes 41 and 42 to form the semiconductor channel layer 38. The thin film transistor has high electron mobility due to the presence of the nanowires. The semiconductor channel layer 38 is formed between the opposite facing lateral surfaces of the source/drain electrodes 41 and 42 by crystallizing the seed layers 36 formed on the opposite facing lateral surfaces of the source/drain electrodes 41 and 42 to form crystal planes and epitaxially growing the nanowires from the crystal planes in a direction parallel to the major surface defining the substrate 31 and perpendicular to the crystal planes. For example, the seed layers 36 are crystallized by oxidizing Zn seeds and crystallizing the Zn oxide. As a result, the nanowires are readily grown from the opposite facing lateral surfaces of the amorphous source/drain electrodes 41 and 42.

According to the exemplary method, only one mask is required to form a pattern of a semiconductor channel as well as source/drain electrodes and a gate electrode of a one-cell thin film transistor, thus contributing to the simplification of the overall processes and the cost reduction of the device.

In accordance with another exemplary embodiment, there is provided a display device comprising the above described thin film transistor of FIGS. 1-3.

In accordance with yet another exemplary embodiment, there is provided an electronic display apparatus comprising the above described thin film transistor of FIGS. 1-3.

The thin film transistor can be used as a switching or driving device of sensors, memory devices, photonic devices, active matrix ("AM") flat panel displays and other devices.

For example, an organic light emitting diode using the thin film transistor has a structure in which an electron injecting layer, an electron transport layer, a light emitting layer, a hole transport layer and a hole injecting layer, etc., are formed on an upper or lower side of a pixel electrode of the thin film transistor. Light is emitted from the light emitting layer.

Further, a liquid crystal display device using the thin film transistor has a structure in which a liquid crystalline material is injected between a panel having the thin film transistor and a panel having a common electrode. The liquid crystal material can be controlled only on a pixel electrode of the thin film transistor. Further, the display device can be applied to a variety of displays, including plasma display panels ("PDPs"), inorganic electroluminescent displays ("ELDs") and field emission displays ("FEDs").

The display device can be applied to a variety of electronic display apparatuses, including liquid crystal projectors, televisions, electronic schedulers, mobile phones and point-of-sale ("POS") terminals.

While exemplary embodiments have been described in further detail with reference to exemplary embodiments, the embodiments are simply for the purpose of illustration. It will be understood by those skilled in the art that various modifications and their equivalents can be made without departing from the spirit and scope of the present invention. Thus, the genuine scope of the technical protection of the present invention should be defined by the spirit of the claims that follow.

What is claimed is:

1. A thin film transistor comprising:
    a source electrode and a drain electrode spaced apart on a substrate; and
    a semiconductor channel layer including:
        nanowires aligned and continuously extending between opposite facing lateral surfaces of the source and drain electrodes in a direction parallel to a major surface defining the substrate,
        the nanowires comprising materials which are deposited on the opposite facing lateral surfaces of the source and drain electrodes,
        wherein a growth process applied to the deposited materials on the opposite facing lateral surfaces of the source and drain electrodes, continuously extends and aligns the materials between the opposite facing lateral surfaces, in the direction parallel to the major surface defining the substrate,
        wherein the thin film transistor has an undercut structure, and
        wherein the undercut structure is defined by the source and drain electrodes disposed on respective spacers, and the source and drain electrodes being longer than the respective spacers on the substrate.

2. The thin film transistor of claim 1, wherein the semiconductor channel layer is composed of bundles of the nanowires.

3. The thin film transistor of claim 1, wherein the nanowires are epitaxially grown from crystal planes formed on the lateral surfaces of the source and drain electrodes in a direction parallel to the major surface defining the substrate.

4. The thin film transistor of claim 3, wherein the nanowires are epitaxially grown from the crystal planes in a direction perpendicular to the crystal planes.

5. The thin film transistor of claim 1, wherein the nanowires are Si, GaN, GaAs or ZnO nanowires.

6. The thin film transistor of claim 1,
    further comprising a gate electrode between the substrate and the semiconductor channel layer,
    the semiconductor channel layer in a pattern between the opposite facing lateral surfaces of the source and drain electrodes,
    the pattern of the semiconductor channel layer defined by the growing the nanowires on the opposite facing lateral surfaces of the source and drain electrodes; and
    the gate electrode between the substrate and the semiconductor channel layer, the source electrode and the drain electrode, and the pattern of the semiconductor channel layer defined by one mask.

7. A display device comprising:
    a thin film transistor, the thin film transistor comprising:
        a source electrode and a drain electrode spaced apart on a substrate; and
        a semiconductor channel layer including:
            nanowires aligned and continuously extending between opposite facing lateral surfaces of the source and drain electrodes in a direction parallel to a major surface defining the substrate,
            the nanowires comprising materials which are deposited on the opposite facing lateral surfaces of the source and drain electrodes,
            wherein a growth process applied to the deposited materials on the opposite facing lateral surfaces of the source and drain electrodes, continuously extends and aligns the materials between the opposite facing lateral surfaces, in the direction parallel to the major surface defining the substrate,
            wherein the thin film transistor has an undercut structure, and
            wherein the undercut structure is defined by the source and drain electrodes disposed on respective spacers, and the source and drain electrodes being longer than the respective spacers on the substrate.

8. The display device of claim 7, wherein the nanowires are epitaxially grown from crystal planes formed on the lateral surfaces of the source and drain electrodes in a direction parallel to the major surface defining the substrate.

9. The display device of claim 8, wherein the nanowires are epitaxially grown from the crystal planes in a direction perpendicular to the crystal planes.

10. The display device of claim 7, wherein the nanowires are Si, GaN, GaAs or ZnO nanowires.

11. The display device of claim 7, wherein the display device is one of: a liquid crystal display; an organic light emitting diode display; a plasma display panel; an inorganic electroluminescent display; and a field emission displays.

12. An electronic display apparatus comprising:
    a thin film transistor, the thin film transistor comprising:
        a source electrode and a drain electrode spaced apart on a substrate; and
        a semiconductor channel layer including:
            nanowires aligned and continuously extending between opposite facing lateral surfaces of the source and drain electrodes in a direction parallel to a major surface defining the substrate,
            the nanowires comprising materials which are deposited on the opposite facing lateral surfaces of the source and drain electrodes,
            wherein a growth process applied to the deposited materials on the opposite facing lateral surfaces of the source and drain electrodes, continuously extends and aligns the materials between the opposite facing lateral surfaces, in the direction parallel to the major surface defining the substrate,
            wherein the thin film transistor has an undercut structure, and
            wherein the undercut structure is defined by the source and drain electrodes disposed on respective spacers, and the source and drain electrodes being longer than the respective spacers on the substrate.

13. The electronic display apparatus of claim 12, wherein the electronic display apparatus includes liquid crystal projectors, televisions, electronic schedulers, mobile phones and point-of-sale ("POS") terminals.

* * * * *